(12) United States Patent
Taki

(10) Patent No.: US 9,608,176 B2
(45) Date of Patent: Mar. 28, 2017

(54) LIGHT-EMITTING DEVICE

(71) Applicant: OSRAM Opto Semiconductors GmbH, Regensburg (DE)

(72) Inventor: Tetsuya Taki, Tokyo (JP)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/443,364

(22) PCT Filed: Nov. 16, 2012

(86) PCT No.: PCT/EP2012/072901
§ 371 (c)(1),
(2) Date: May 15, 2015

(87) PCT Pub. No.: WO2014/075737
PCT Pub. Date: May 22, 2014

(65) Prior Publication Data
US 2016/0218256 A1    Jul. 28, 2016

(51) Int. Cl.
*H01L 29/20*    (2006.01)
*H01L 33/50*    (2010.01)
(Continued)

(52) U.S. Cl.
CPC ........ *H01L 33/505* (2013.01); *H01L 25/0753* (2013.01); *H01L 33/32* (2013.01);
(Continued)

(58) Field of Classification Search
CPC ... H01L 33/505; H01L 33/60; H01L 25/0753; H01L 33/32
See application file for complete search history.

(56) References Cited

U.S. PATENT DOCUMENTS

2004/0046178 A1    3/2004    Sano
2007/0205711 A1    9/2007    Takashima et al.
(Continued)

FOREIGN PATENT DOCUMENTS

JP    2004088003 A    3/2004
JP    2010519709 A    6/2010
(Continued)

OTHER PUBLICATIONS

Khan, T. Q. et al., "LED Lighting: Technology and Preception", 2015, p. 455, Wiley VCH Verlag GmbH & Co., Weinheim, Germany.
(Continued)

*Primary Examiner* — Elias M Ullah
(74) *Attorney, Agent, or Firm* — McDermott Will & Emery LLP

(57) ABSTRACT

A light-emitting device is specified, said device comprising: a light-emitting semiconductor element (23) which emits greenish white light (10) during operation of the device, a filter element (4) which has a higher optical transmittance (11) in a spectral region of red light than in a spectral region of blue and green light, wherein the filter element (4) is arranged in such a way with respect to the light-emitting semiconductor element (23) that solely filtered light (12) which passes through the filter element (4) is emitted by the device during operation of the device, and the filtered light (12) is warm-white light.

13 Claims, 5 Drawing Sheets

(51) Int. Cl.
*H01L 33/44* (2010.01)
*H01L 25/075* (2006.01)
*H01L 33/32* (2010.01)
*H01L 33/60* (2010.01)
*H01L 33/62* (2010.01)

(52) U.S. Cl.
CPC .............. *H01L 33/44* (2013.01); *H01L 33/60* (2013.01); *H01L 33/62* (2013.01); *H01L 2924/0002* (2013.01)

(56) References Cited

U.S. PATENT DOCUMENTS

| | | |
|---|---|---|
| 2008/0259589 A1 | 10/2008 | Van De Ven |
| 2009/0159904 A1 | 6/2009 | Lai et al. |
| 2015/0326117 A1* | 11/2015 | Tischler ............. H05B 33/0815 315/185 R |

FOREIGN PATENT DOCUMENTS

| WO | 2007/005003 A1 | 1/2007 |
|---|---|---|
| WO | 2012/101022 A1 | 8/2012 |

OTHER PUBLICATIONS

Khan, T. Q. et al., "LED Lighting: Technology and Perception", Nov. 28, 2014, p. 455, Wiley VCH Verlag GmbH & Co., Weinheim, Germany.

* cited by examiner

LIGHT-EMITTING DEVICE

A light-emitting device is specified.

The document WO 2012/101022 A1 describes a lighting module for emitting mixed light. Said lighting module comprises at least one first semiconductor element which emits unconverted red light and at least one second semiconductor element which emits converted greenish white light having a first conversion percentage, at least one third semiconductor element which emits greenish white light having a second conversion percentage that is smaller than the first conversion percentage and at least one resistor element having a temperature-dependent electric resistance, the second semiconductor element being connected in parallel to the third semiconductor element.

For example, an NTC (Negative Temperature Coefficient) resistor is used as a resistor element. The resistor element can be used to compensate a brightness and wavelength shift due to a change in the operating temperature for the red light emitting semiconductor element. This is due to the fact that the temperature properties of the red light emitting light-emitting diodes and greenish white light emitting light-emitting diodes are different. For example, a red light emitting light-emitting diode has a larger brightness and wavelength shift dependent on the operating temperature. If a temperature-dependent electric resistance is not used for the compensation of the temperature dependency colour shifts of the emitted light occur during operation of the lighting module. For example, it then can take up to 30 minutes until the temperature and, therefore the colour of the emitted light, keep constant.

It is one object of the present invention to specify a light-emitting device which can be produced at a low cost and which shows no or reduced temperature dependency of the colour of the emitted light.

According to at least one aspect of the light-emitting device, the light-emitting device comprises a light-emitting semiconductor element which emits greenish white light during operation of the device. The light-emitting semiconductor element emits light which has a mint-like colour. For example, the greenish white light is light with chromaticity coordinates in the CIE 1931 colour space of $0.26 \leq x \leq 0.43$ and $0.26 \leq y \leq 0.53$.

According to one aspect of the light-emitting device, the light-emitting device comprises a filter element which has a higher optical transmittance in a spectral region of red light than in a spectral region of blue and green light. For example, the optical filter element has a high optical transmittance of between greater than 50% and at most 100% for a wavelength region between 590 nm and 680 nm. For example the transmittance for blue and green light is smaller than 50%.

The filter element can be an absorptive filter. The filter element is, for example, formed with a matrix material like glass or a plastic material like polycarbonate or acrylic wherein the matrix material is filled with inorganic or organic compounds like inorganic or organic dyes. These compounds in the matrix material absorb a part of the light passing through the filter depending on the wavelengths of the light.

The transmittance of the filter for blue and green light can be adapted by choosing the compounds in the matrix material and by choosing the density of the compounds in the matrix material. The smaller the density of the blue and green light absorbing compounds in the matrix material, the greater becomes the transmittance for these colours.

According to at least one aspect of the light-emitting device, the filter element is arranged in such a way with respect to the light-emitting semiconductor element that solely filtered light which passes through the filter element is emitted by the device during operation of the device. That means that light can only leave the light-emitting device after passing through the filter element. There is no light emission by the light-emitting device of unfiltered light which has not passed through the filter element.

According to one aspect of the light-emitting device, the filtered light which is emitted by the light-emitting device is warm-white light. In this context, warm-white light is light having a colour temperature of less than 3,300 Kelvin.

According to one aspect of the light-emitting device, the light-emitting device comprises a light-emitting semiconductor element which emits greenish white light during operation of the device, a filter element which has a higher optical transmittance in a spectral region of red light than in the spectral region of blue and green light, wherein the filter element is arranged in such a way with respect to the light-emitting semiconductor element that solely filtered light which passes through the filter element is emitted by the device during operation of the device and the filtered light is warm-white light.

Due to the filter element of the light-emitting device it is possible for the light-emitting device to emit warm-white light without using an additional light-emitting semiconductor element which emits red or amber light. Therefore, it is not necessary to employ a temperature-dependent electrical resistance and, though such a resistance is not used, there is no or less operation temperature-depending colour shift in the light emitted by the device.

The filter element, for example, comprises a filter compound which can be mixed into a matrix material. Thereby, it is preferred that the compound itself is not light-emitting. That means, for example, that the compound is free of a wavelength-conversion material like a phosphor, but the compound comprises absorbing materials like organic or inorganic dyes. Such a device is particularly easy and cost-effective to produce.

According to at least one aspect of the light-emitting device, the light-emitting device comprises two or more light-emitting semiconductor elements. All of the light-emitting elements then emit light for the same filter element. For example, the light of two or more light-emitting semiconductor elements impinges on the same filter element and is filtered by this filter element.

According to one aspect of the light-emitting device, the filter element has the shape of a dome or the shape of a globe and spans the light-emitting semiconductor element. For example, the filter element surrounds the light-emitting semiconductor element from at least four sides. If the filter element is in the shape of a globe it is even possible that the filter element surrounds the light-emitting semiconductor element completely where the filter element has only small openings for connection elements for electrical connecting the light-emitting semiconductor element.

Thereby the light-emitting device for example comprises a carrier element like a circuit board for the light-emitting semiconductor element, wherein the filter element surrounds the carrier element completely. The filter element provides mechanically protection for the carrier element and the light-emitting semiconductor element. Further the filter element can be electrically insulating and provides electrical protection for the carrier element and the light-emitting semiconductor element.

Further it is possible that the light-emitting device comprises at least two light-emitting semiconductor elements, wherein at least two of the light-emitting semiconductor elements are arranged on at least two different, e.g. opposite, sides of the carrier element. This enables a device which emits light in all directions.

Filter elements in the shape of a dome or a globe have the advantage that a large part of the light emitted by the light-emitting semiconductor element directly impinges on the filter element without being reflected on, for example, a reflecting element like a mirror, before impinging on the filter element. Thus, the loss of light due to reflection is reduced. Further, the probability of total reflection for light impinging on the filter element is reduced for a curved filter element which is, for example, in the shape of a dome or a globe.

According to one aspect of the light-emitting device, the filter element has the shape of a plate which covers the light-emitting semiconductor element. For example, the filter element is used as a covering plate for a housing of the light-emitting semiconductor element. Such a filter element which has the shape of a plate is particularly easy to produce.

According to one aspect of the light-emitting device, the light-emitting semiconductor element of the device consists of or comprises a light-emitting diode chip having an active region which emits blue light during operation of the device and a converter element which converts the blue light in part into yellow-green light such that the light-emitting semiconductor element emits greenish white light during operation of the device. The converter element, for example, covers at least a part of the surface of the light-emitting diode chip and comprises a phosphor for a wavelength conversion of the blue light emitted by the light-emitting diode chip.

According to one aspect of the light-emitting device, the light-emitting device comprises a light reflecting element which reflects a greenish white light at least in part in the direction of the filter element. For example a carrier on which the light-emitting element is mounted, has a reflecting outer surface on the side of the carrier on which the light-emitting element is mounted. Further, it is possible that the light reflecting element is formed by the outer surface of a housing in which the light-emitting element is arranged.

According to at least one aspect of the light-emitting device the filter element has a transmittance of below 50% for a wavelength below 590 nm. That is to say, blue and green light emitted by the light-emitting semiconductor element is at least in part absorbed by the filter element or reflected in the direction of the reflecting element. For a wavelength region of wavelength of greater than 590 nm, the transmittance of the filter element can be up to 100%.

According to one aspect of the light-emitting device, the light-emitting device comprises at least two light-emitting diode chips wherein all light-emitting diode chips of the light-emitting device are based on the same semiconductor material. This has the advantage that all light-emitting diode chips of the light-emitting device show the same temperature dependency of the emitted light. Therefore, the temperature dependency of the colour of the emitted light can be drastically reduced without using a temperature-dependent electrical resistance for compensating different temperature dependencies of the light-emitting diode chips.

For example, the semiconductor material is a nitride compound semiconductor material.

In the present context, a nitride compound semiconductor material means that a subregion of the light-emitting diode chip or at least one part thereof, comprises or consists of a nitride compound semiconductor material, for example GaN, $Al_nGa_{1-n}N$, $In_nGa_{1-n}N$ or else $Al_nGa_mIn_{1-n-m}N$, where $0 \leq n \leq 1$, $0 \leq m \leq 1$ and $n+m \leq 1$. In this case, this material does not necessarily need to have a mathematically exact composition according to the above formula. Rather, it can comprise, for example, one or more dopants and additional constituents. For the sake of simplicity, however, the above formula only comprises the essential constituents of the crystal lattice (Al, Ga, In, N), even if these can be replaced and/or supplemented in part by small amounts of further substances. However, a nitride compound semiconductor material always comprises nitrogen or a nitrogen compound.

According to at least one aspect of the light-emitting diode chip, each light-emitting diode chip of the device is based on a nitride compound semiconductor material comprising indium. Such an indium comprising nitride compound semiconductor material is a material that has a good thermal stability at the desired wavelength emitted by this material.

In the following advantageous embodiments and developments of the device will become apparent from the exemplary embodiments described below in association with the figures.

In the exemplary embodiments and figures similar or similarly acting constituent parts are provided with the same reference signals. The elements illustrated in the figures and their size relationship to one another should not be regarded as true to scale. Rather, individual elements may be represented with an exaggerated size for the sake of better understanding.

Figure 1A:
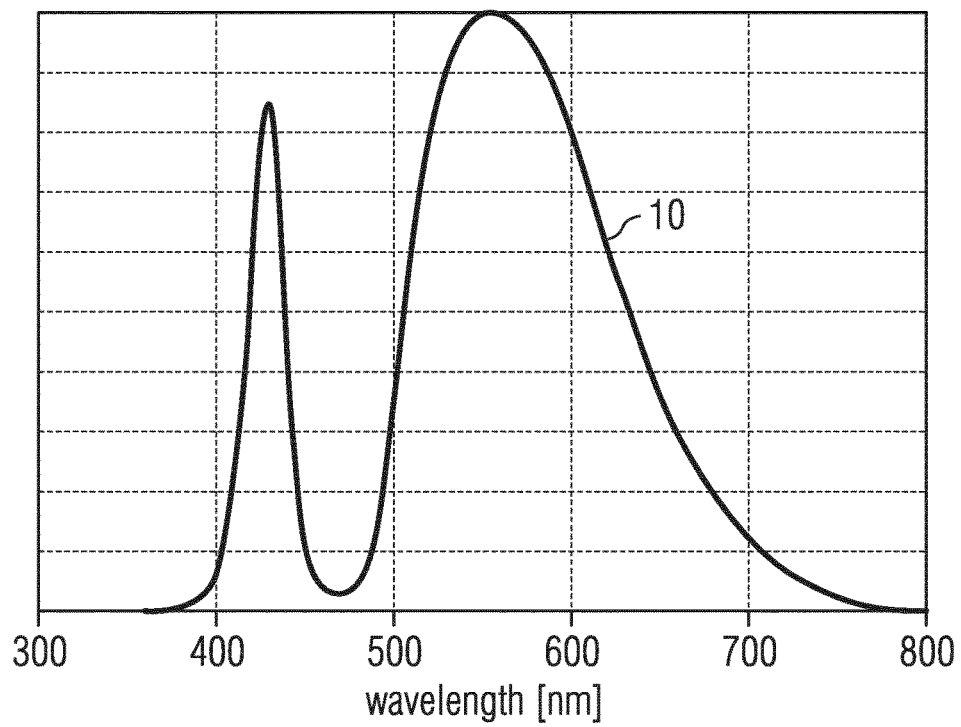
FIGS. 1A, 1B, 1C show exemplary emission spectra for an embodiment of a here-described light-emitting device.

FIG. 1A shows the spectrum of a light-emitting semiconductor element 23 as used in a here-described light-emitting device. That is to say, FIG. 1A shows the spectrum of greenish white light 10. The spectrum shows peaks in the region of blue and in the region of yellow-green light. The peak in the region of blue light stems from light emitted by a light-emitting diode chip 2 of the light-emitting semiconductor element. The peak in the region of yellow-green light stems from light emitted by a converter element 3 of the light-emitting semiconductor element 23.

Figure 1B:
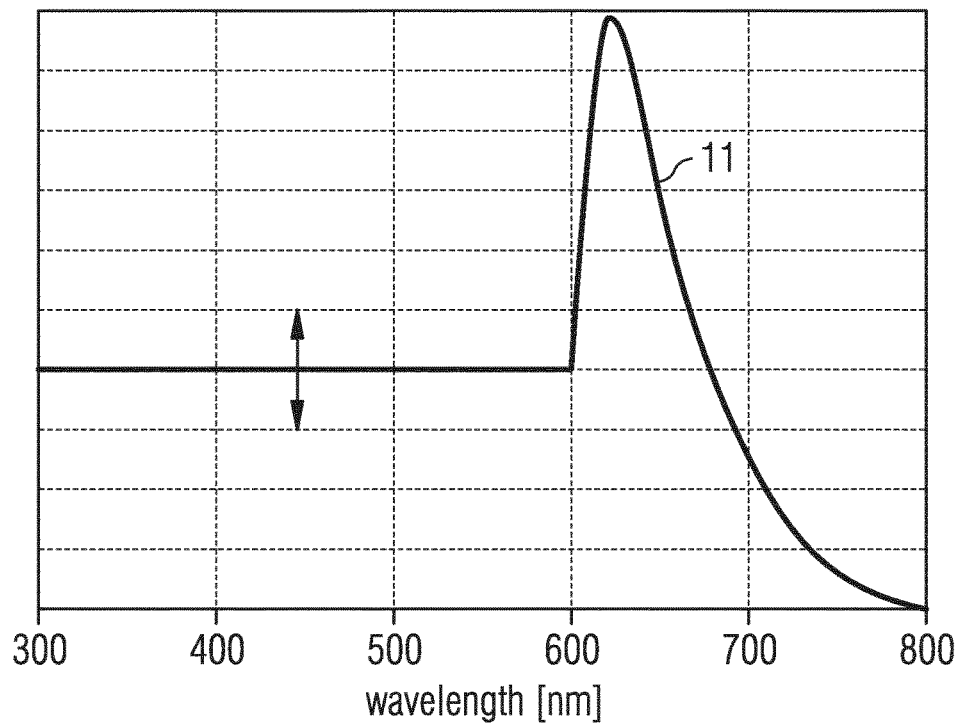

FIG. 1B shows the optical transmittance 11 of a filter element 4 used in a here-described light-emitting semiconductor element 23. As becomes clear from FIG. 1B the transmittance is low for blue and green light and high for light having a wavelength greater than 590 nm. For example, for wavelengths of below 590 nm the transmittance is in the region of smaller than 50%. As indicated by the arrows in FIG. 1B, the transmittance in this region can be adapted by, for example, changing the density of filter compounds in the filter element 4 or by changing the thickness of the filter element 4.

Figure 1C:
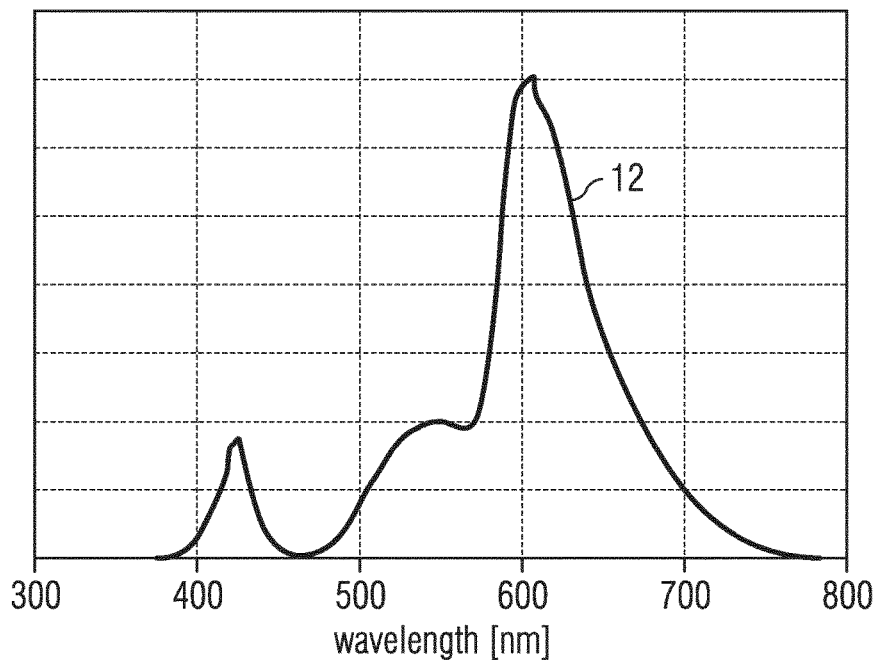

FIG. 1C shows the spectrum of filtered light 12 which results when a light-emitting semiconductor element 23 with the spectrum of greenish white light 10 from FIG. 1A is combined with a filter element 4 showing the optical transmittance 11 of FIG. 1B.

The resulting light is white light having a colour temperature of <3,300 Kelvin.

Figure 3A:
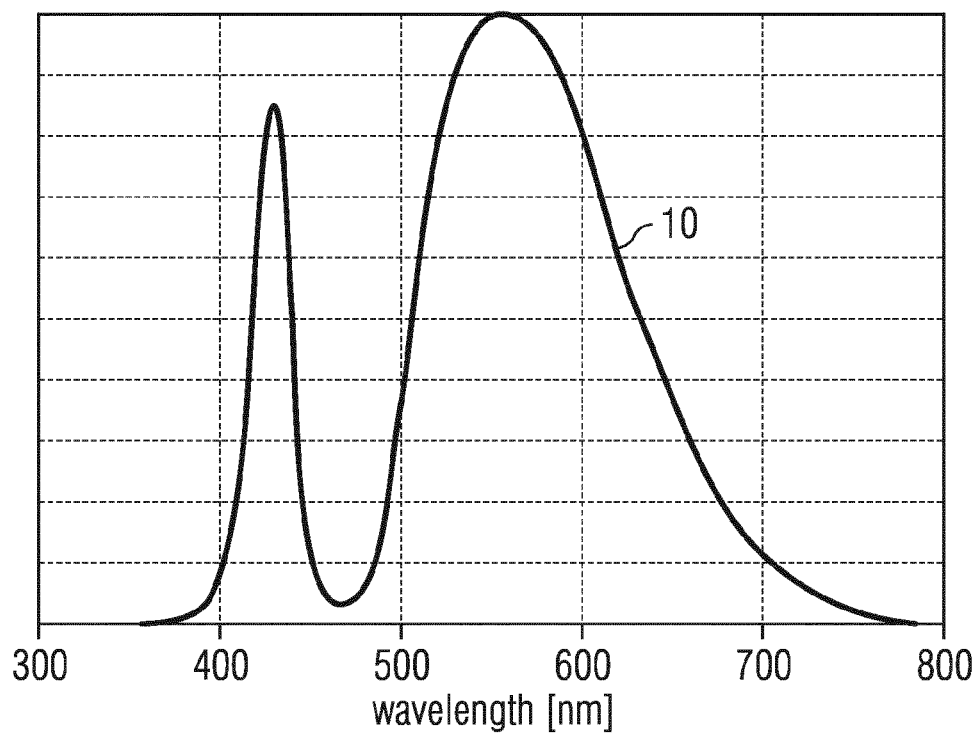
FIGS. 3A, 3B, 3C show emission spectra of devices of an alternative design.
Figure 3B:
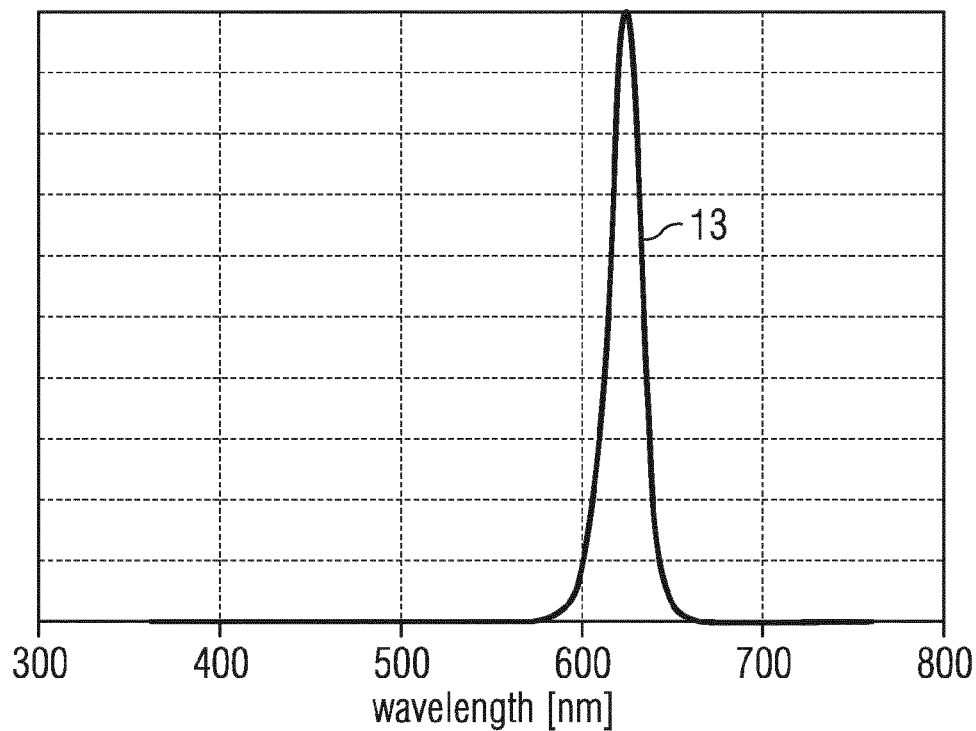
Figure 3C:
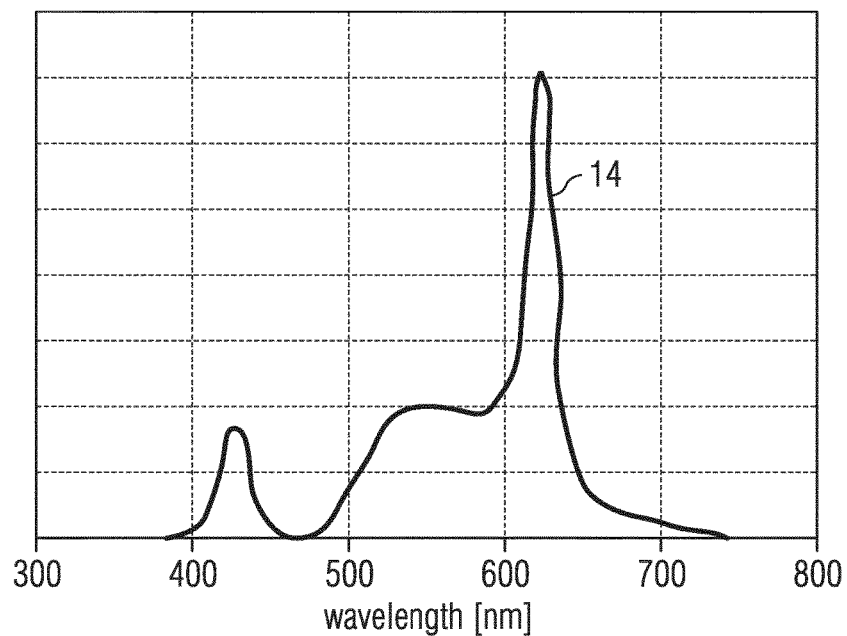

For comparison, FIGS. 3A through 3C show spectra for a light-emitting device where an amber or red light-emitting diode is used instead of a filter element. FIG. 3A shows the spectrum of greenish white light 10 as already explained in connection with FIG. 1A.

FIG. 3B shows the spectrum of light emitted by an amber or red light emitting element 13 having a peak in the region of red or amber light. If this light is combined with the greenish white light of FIG. 3A, the combined spectrum 14 of FIG. 3C results. As becomes apparent by a comparison of the spectra of FIG. 1C and FIG. 3C, the filter element 4 can be used to compose a spectrum which is very similar to the spectrum resulting from the combination of the amber light-emitting diode and a greenish white light emitting element. However, the light emitted by a here-described light-emitting device is less prone to temperature changes and therefore results in a more constant light production with respect to light colour and light temperature.

Figure 2A:
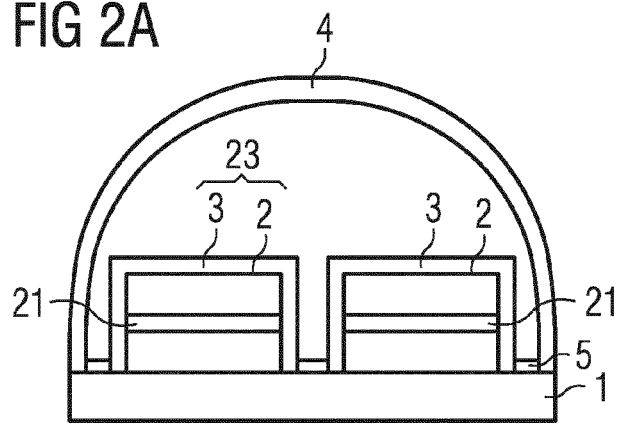
FIGS. 2A, 2B, 2C show exemplary embodiments of here-described devices.

FIG. 2A shows a first embodiment of a here-described light-emitting device in a schematic sectional view.

The light-emitting device comprises a carrier 1. The carrier 1 is, for example, a connection carrier like a circuit board or a metal core board.

The light-emitting device further comprises light-emitting elements 23. Each light-emitting element 23 comprises a light-emitting diode chip 2. For example the light-emitting diode chip 2 comprises an active region 21 in which blue light is produced during operation of the device. The light-emitting diode chip is, for example, based on a nitride compound semiconductor material comprising indium.

Each light-emitting semiconductor element 23 further comprises a converter element 3 which is applied to at least parts of the surface of the light-emitting diode chip 2. The converter element 3 comprises phosphors and absorbs a part of the blue light emitted by the light-emitting diode chip 2 and emits yellow-green light. As a result, the light-emitting semiconductor element 23 emits mixed light 10 of a greenish white colour.

The light-emitting device further comprises a filter element 4 which spans the light-emitting semiconductor elements 23 and has the shape of a dome. The filter element is, for example, formed with a matrix material which consists of glass or a plastic material into which filter compounds are mixed.

Optionally, the light-emitting semiconductor element comprises a reflective element 5 which is, for example, arranged on the same side of the carrier element 1 to which the light-emitting semiconductor elements 23 are mounted. The reflecting element 5, for example, is comprised of a metal or a metal-oxide material like silver or $TiO_2$. The reflecting element reflects light produced by the light-emitting semiconductor element and light reflected from the filter element in the direction of the filter element 4 and therefore enhances the portion of light impinging on the filter element 4.

Figure 2B:
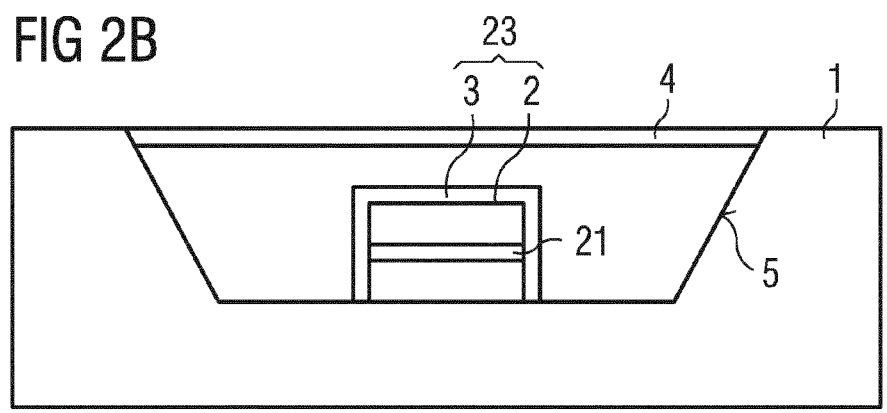

FIG. 2B shows a further embodiment of a here-described light-emitting device. In this embodiment the light-emitting device comprises a carrier element 1 which is a housing for the light-emitting element 23. The housing comprises a recess into which the light-emitting element 23 is arranged. The light-emitting element 23 is surrounded by sidewalls of the carrier element 1 which form the reflecting element 5.

The filter element 4 of the embodiment shown in FIG. 2B is in the shape of a plate which covers the light-emitting element 23 and forms a covering plate of the housing given by the carrier element 1.

Figure 2C:
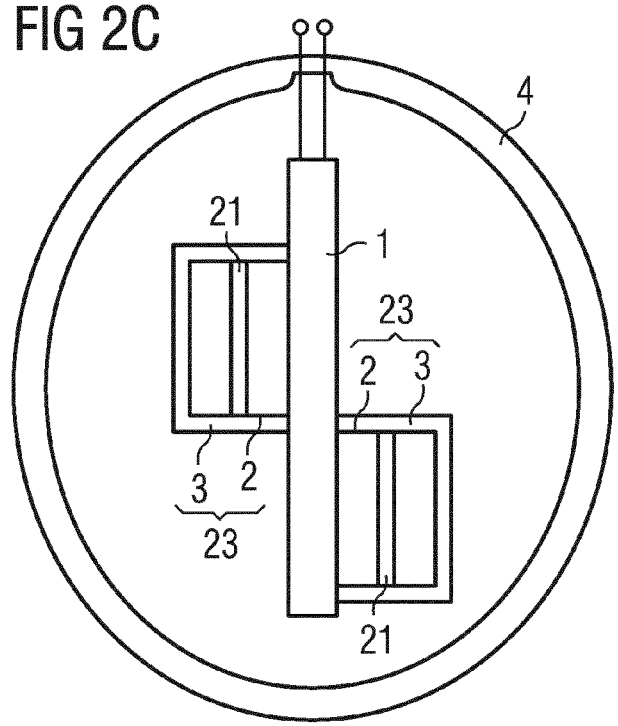

FIG. 2C shows a further embodiment of a here-described light-emitting device. In this embodiment, the filter element 4 is in the shape of a globe. The light-emitting elements 23 are arranged on at least two sides of carrier element 1. It results a light-emitting device which is able to emit filtered light 12 in all directions.

Advantageously a here-described light-emitting element can be used, for example, as a retrofit LED light bulb which can be used instead of energy-saving lamps or conventional filament lamps.

The invention is not limited to specific embodiments but comprises any combination of elements of different embodiments. Moreover, the invention comprises any combination of claims and any combination of features disclosed by the claims.

The invention claimed is:

1. A light-emitting device comprising:
a light-emitting semiconductor element which emits greenish white light during operation of the device; and
a filter element which has a higher optical transmittance in a spectral region of red light than in a spectral region of blue and green light,
wherein
the filter element is arranged in such a way with respect to the light-emitting semiconductor element that solely filtered light which passes through the filter element is emitted by the device during operation of the device, and
the filtered light is warm-white light with a color temperature of less than 3300 K.

2. The light-emitting device according to claim 1, wherein the filter element has the shape of a dome or the shape of a globe and spans the light-emitting semiconductor element.

3. The light-emitting device according to claim 2, wherein the filter element has the shape of a globe and the filter element surrounds the light-emitting semiconductor element completely.

4. The light-emitting device according to claim 3, further comprising:
a carrier element for the light-emitting semiconductor element, wherein the filter element surrounds the carrier element completely.

5. The light-emitting device according to claim 4, further comprising:
at least two light-emitting semiconductor elements, wherein at least two of the light-emitting semiconductor elements are arranged on at least two different sides of the carrier element.

6. The light-emitting device according to claim 1, wherein the filter element has the shape of a plate which covers the light-emitting semiconductor element.

7. The light-emitting device according to claim 1, wherein the light-emitting semiconductor element consists of or comprises a light-emitting diode chip having an active region which emits blue light during operation of the device and a converter element which converts the blue light in part into yellow-green light such that the light-emitting semiconductor element emits the greenish white light during operation of the device.

8. The light-emitting device according to claim 1, comprising a light reflecting element which reflects the greenish white light at least in part in direction of the filter element.

9. The light-emitting device according to claim 1, wherein the filter element has a transmittance below 50 percent for a wavelength below 590 nm.

10. The light-emitting device according to claim 1, comprising at least two light-emitting diode chips wherein all light-emitting diode chips of the light-emitting device are based on the same semiconductor material.

11. The light-emitting device according to claim 10, wherein the semiconductor material is a nitride compound semiconductor material.

12. A light-emitting device comprising:
a carrier element;
at least two light-emitting semiconductor elements, wherein the at least two light-emitting semiconductor elements are arranged on at least two different sides of the carrier element, wherein the at least two light-emitting semiconductor elements emit greenish white light during operation of the device; and
a filter element which has a higher optical transmittance in a spectral region of red light than in a spectral region of blue and green light,
wherein
the filter element has a transmittance below 50 percent for a wavelength below 590 nm,
the filter element is arranged in such a way with respect to the at least two light-emitting semiconductor elements that solely filtered light which passes through the filter element is emitted by the device during operation of the device,
the filtered light is warm-white light with a color temperature of less than 3300 K,
the filter element has the shape of a globe and the filter element surrounds the at least two light-emitting semiconductor elements completely,
the filter element surrounds the carrier element completely, and
the light-emitting device is free of an additional light-emitting semiconductor element which emits red or amber tight.

13. A light-emitting device comprising:
a light-emitting semiconductor element which emits greenish white light during operation of the device; and
a filter element which has a higher optical transmittance in a spectral region of red light than in a spectral region of blue and green light,
wherein
the filter element is arranged in such a way with respect to the light-emitting semiconductor element that solely filtered light which passes through the filter element is emitted by the device during operation of the device, and
the filtered light is warm-white light with a color temperature of less than 3300 K, and
the light-emitting device is free of an additional light-emitting semiconductor element which emits red or amber light.

* * * * *

UNITED STATES PATENT AND TRADEMARK OFFICE
CERTIFICATE OF CORRECTION

PATENT NO.        : 9,608,176 B2                                    Page 1 of 1
APPLICATION NO.   : 14/443364
DATED             : March 28, 2017
INVENTOR(S)       : Tetsuya Taki It is certified that error appears in the above-identified patent and that said Letters Patent is hereby corrected as shown below:

In the Claims

In Column 8, Line 8:
Replace "amber tight" with --amber light--.

Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*